United States Patent [19]
Takenouchi et al.

[11] Patent Number: 5,744,758
[45] Date of Patent: Apr. 28, 1998

[54] MULTILAYER CIRCUIT BOARD AND PROCESS OF PRODUCTION THEREOF

[75] Inventors: Toshikazu Takenouchi; Mikiko Wakabayashi, both of Nagano, Japan

[73] Assignee: Shinko Electric Industries Co., Ltd., Nagano, Japan

[21] Appl. No.: 695,387

[22] Filed: Aug. 9, 1996

[30] Foreign Application Priority Data

Aug. 11, 1995 [JP] Japan ................................ 7-205623
Jun. 24, 1996 [JP] Japan ................................ 8-162688

[51] Int. Cl.$^6$ ........................ H05K 1/00; B32B 3/00; B32B 15/08
[52] U.S. Cl. ..................... 174/255; 174/263; 428/209; 428/458; 428/901
[58] Field of Search ..................... 428/209, 901, 428/458; 174/250, 263, 255

[56] References Cited

U.S. PATENT DOCUMENTS

| | | | |
|---|---|---|---|
| 3,672,986 | 6/1972 | Schneble, Jr. et al. | 428/209 |
| 3,700,538 | 10/1972 | Kennedy | 428/901 |
| 3,742,597 | 7/1973 | Davis | 174/263 |
| 4,595,606 | 6/1986 | St. John et al. | 427/96 |
| 4,839,232 | 6/1989 | Morita et al. | 428/901 |
| 4,883,718 | 11/1989 | Ohta et al. | 428/901 |
| 5,108,825 | 4/1992 | Wojnarowski et al. | 428/901 |
| 5,263,243 | 11/1993 | Taneda et al. | 174/263 |
| 5,286,926 | 2/1994 | Kimura et al. | 174/250 |
| 5,326,636 | 7/1994 | Durand et al. | 428/323 |
| 5,326,643 | 7/1994 | Adamopoulos et al. | 428/901 |
| 5,340,947 | 8/1994 | Credle et al. | 174/263 |
| 5,346,750 | 9/1994 | Hatakeyama et al. | 428/901 |
| 5,374,469 | 12/1994 | Hino et al. | 428/209 |
| 5,478,972 | 12/1995 | Mizutani et al. | 174/250 |
| 5,497,545 | 3/1996 | Watanabe et al. | 174/263 |
| 5,601,905 | 2/1997 | Watanabe et al. | 428/901 |
| 5,621,068 | 4/1997 | Okamoto et al. | 428/901 |

FOREIGN PATENT DOCUMENTS 4-94186  3/1992  Japan .

*Primary Examiner*—Paul J. Thibodeau
*Assistant Examiner*—Cathy F. Lam
*Attorney, Agent, or Firm*—Pennie & Edmonds LLP

[57] ABSTRACT

A multilayer circuit board includes a plurality of substrates. Each of the substrates includes a thermosetting resin film having respective surfaces, a metal layer formed on the one of the surfaces and a thermoplastic polyimide film formed on the other surface. Each of the substrates has at least one via hole, which is filled with thermoplastic polyimide resin containing electrically conductive material to form an electrically conductive via. The metal layer is defined as a predetermined circuit pattern electrically connected to the via. The plurality of substrates are laminated in such a manner that the substrate is adhered to an adjacent one by means of the thermoplastic polyimide film.

7 Claims, 6 Drawing Sheets

MULTILAYER CIRCUIT BOARD AND PROCESS OF PRODUCTION THEREOF

BACKGROUND OF THE INVENTION

1. Field of the Invention

The present invention relates to a multilayer circuit board and a process of the production thereof, specifically to a multilayer circuit board wherein a plurality of thermosetting resin films, each carrying circuit patterns, are layered with each other and a process of the production thereof.

2. Description of the Related Art

In a multilayer circuit board wherein a plurality of thermosetting resin films, each carrying circuit patterns, are layered with each other, generally speaking, there are two methods for electrically conducting between the circuit patterns carried on the respective surfaces.

One is a via-hole plating method wherein, after an electroless plating has been applied to the inner walls of via-holes formed in the thermosetting resin films by a laser beam or a drill, an electro-plating is applied thereon to form a plated coating so that the electro-conductivity is provided between the circuit patterns through the plated coating.

The other is a filling method wherein via-holes formed in the thermosetting resin films are filled with a copper paste, a silver paste or a thermosetting electro-conductive resin paste prepared by mixing metallic particles of gold, silver or copper with epoxy resin or phenolic resin, to provide vias after the paste has been -cured.

However, the via-hole plating method has a problem in that a production cost becomes higher because the two-stage plating process including both of the electroless plating and the electro-plating is indispensable for ensuring the reliability of the plated coating.

On the other hand, in the latter method wherein the electro-conductive resin is filled in the via-holes, there is a problem in that a gas may generate in the electro-conductive resin paste filling the via-hole during the thermosetting process thereof, which causes a volume reduction of the resin or a generation of voids therein to deteriorate the electro-conductivity.

Furthermore, a cross-linking type thermosetting electro-conductive resin paste, typically containing epoxy or phenolic resin, loses the elasticity to a great extent after the curing, which may result in a generation of cracks in the vias when the heating and cooling are repeated, due to the unbalance in the thermal expansion/contraction rates between materials constituting the circuit board and the vias.

SUMMARY OF THE INVENTION

Accordingly, an object of the present invention is to provide a reliable multilayer circuit board wherein the electro-conductivity of a via is well ensured and the thermal expansion/contraction rates of a material of the circuit board is well balanced to that of a via so that the via is free from the generation of cracks and thus the electro-conductivity thereof is ensured.

According to an aspect of the present invention, there is provided a multilayer circuit board comprising:
a plurality of substrates:
each of said substrates comprising: a thermosetting resin film having first and second surfaces, a metal layer formed on said first surface and a thermoplastic polyimide film formed on said second surface;
each of said substrates having at least one via hole, which is filled with thermoplastic polyimide resin containing electrically conductive material to form an electrically conductive via; and
said metal layer being defined as a predetermined circuit pattern electrically connected to said via; and
said plurality of substrates being laminated in such a manner that said substrate is adhered to an adjacent one by means of said thermoplastic polyimide film.

According to another aspect of the present invention, there is provided a multilayer circuit board comprising:
one or more first substrates:
each of said first substrates comprising: a thermosetting resin film having first and second surfaces, a metal layer formed on said first surface and a thermoplastic polyimide film formed on said second surface;
each of said first substrates having at least one via hole, which is filled with thermoplastic polyimide resin containing electrically conductive material to form a first electrically conductive via; and
said metal layer being defined as a predetermined circuit pattern electrically connected to said first via; and
a second substrate comprising: a thermosetting resin film having respective surfaces, metal layers formed on said respective surfaces, said second substrate having at least one via hole in which a second electrically conductive via is formed, and said metal layers being defined as predetermined respective circuit patterns electrically connected to said second via;
said one or more first substrates and said second substrate being laminated in such a manner that said respective substrate is adhered to the adjacent one by means of said thermoplastic polyimide film of the respective first substrate.

According to still another aspect of the present invention, there is provided a multilayer circuit board comprising:
one or more first substrates:
each of said first substrates comprising: a thermosetting resin film having first and second surfaces, a metal layer formed on said first surface and a thermoplastic polyimide film formed on said second surface;
each of said first substrates having at least one via hole, which is filled with thermoplastic polyimide resin containing electrically conductive material to form a first electrically conductive via; and
said metal layer being defined as a predetermined circuit pattern electrically connected to said first via; and
a second substrate comprising: a thermosetting resin film having respective surfaces, a metal layer formed on one of said respective surfaces, said second substrate having at least one terminal hole penetrating said thermosetting resin film, said metal layer being defined as a predetermined circuit pattern, a part of which covers one end of said terminal hole;
said one or more first substrates and said second substrate being laminated to form a laminated structure in such a manner that said terminal hole is opened outside and said respective substrate is adhered to the adjacent one by means of said thermoplastic polyimide film of the respective first substrate.

According to further aspect of the present invention, there is provided a multilayer circuit board comprising:
a plurality of substrates:
each of said substrates comprising: a thermosetting resin film having first and second surfaces, a metal layer formed on said first surface and a thermoplastic polyimide film formed on said second surface;

each of said substrates having at least one via hole penetrating thereof, except for said metal layer, in such a manner that a part of said metal layer is exposed to a bottom of said via-hole;

a plated layer having a predetermined thickness and thermoplastic polyimide resin containing electrically conductive material being laminated, in turn, in said via-hole to form an electrically conductive via; and said metal layer being defined as a predetermined circuit pattern electrically connected to said via; and said plurality of substrates being laminated in such a manner that said substrate is adhered to an adjacent one by means of said thermoplastic polyimide film.

According to still further aspect of the present invention, there is provided a multilayer circuit board comprising:

one or more first substrates:

each of said first substrates comprising: a thermosetting resin film having first and second surfaces, a metal layer formed on said first surface and a thermoplastic polyimide film formed on said second surface;

each of said substrates having at least one via hole penetrating thereof, except for said metal layer, in such a manner that a part of said metal layer is exposed to a bottom of said via-hole;

a plated layer having a predetermined thickness and thermoplastic polyimide resin containing electrically conductive material being laminated, in turn, in said via hole to form an electrically conductive via; and said metal layer being defined as a first predetermined circuit pattern electrically connected to said first via;

a second substrate comprising: a thermosetting resin film having respective surfaces, metal layers formed on said respective surfaces, said second substrate having at least one via hole in which a second electrically conductive via is formed, and said metal layers being defined as predetermined respective circuit patterns electrically connected to said second via; and said one or more first substrates and said second substrate being laminated in such a manner that said respective substrate is adhered to the adjacent one by means of said thermoplastic polyimide film of the respective first substrate.

According to still further aspect of the present invention, there is provided a multilayer circuit board comprising:

one or more first substrates:

each of said first substrates comprising: a thermosetting resin film having first and second surfaces, a metal layer formed on said first surface and a thermoplastic polyimide film formed on said second surface;

each of said first substrates having at least one via hole penetrating thereof, except for said metal layer, in such a manner that a part of said metal layer is exposed to a bottom of said via-hole;

a plated layer having a predetermined thickness and thermoplastic polyimide resin containing electrically conductive material being laminated, in turn, in said via-hole to form a first electrically conductive via; and said metal layer being defined as a first predetermined circuit pattern electrically connected to said first via; and a second substrate comprising: a thermosetting resin film having respective surfaces, a metal layer formed on one of said respective surfaces, said second substrate having at least one terminal hole penetrating said thermosetting resin film, said metal layer being defined as a predetermined circuit pattern, a part of which covers one end of said terminal hole; and said one or more first substrates and said second substrate being laminated to form a laminated structure in such a manner that said terminal hole is opened outside and said respective substrate is adhered to the adjacent one by means of said thermoplastic polyimide film of the respective first substrate.

In a process for producing a multilayer circuit board, said process according to the present invention, said process comprising:

preparing a plurality of substrates each comprising a thermosetting resin film having first and second surfaces, a metal layer formed on said first surface and a thermoplastic polyimide film formed on said second surface;

providing each of said substrates with at least one via hole;

filling said via hole with thermoplastic polyimide paste containing electrically conductive material;

heating said each of said substrates to evaporate any solvent in said paste to form an electrically conductive via and forming with said metal layer to a predetermined circuit pattern which is electrically connected to said via; and laminating said plurality of substrates by heat-pressing so that said substrate is adhered to an adjacent one by means of said thermoplastic polyimide film.

In another process for producing a multilayer circuit board, said process according to the present invention, said process comprising:

preparing a plurality of substrates each comprising a thermosetting resin film having first and second surfaces, a metal layer formed on said first surface and a thermoplastic polyimide film formed on said second surface;

providing each of said substrates with at least one via hole so that said via hole penetrates said substrate, except for said metal layer;

forming a plated layer having a predetermined thickness in said via hole and thereafter filling said via hole with thermoplastic polyimide paste containing electrically conductive material;

heating said each of said substrates to evaporate any solvent in said paste to form an electrically conductive via;

forming with said metal layer to a predetermined circuit pattern which is electrically connected to said via; and laminating said plurality of substrates by heat-pressing so that said substrate is adhered to an adjacent one by means of said thermoplastic polyimide film.

In the multilayer circuit board of the present invention, since the via is formed of an electro-conductive thermoplastic resin, no gas generates, unlike the thermosetting resin, during the heat treatment in the production process, which gas would be caused by the evaporation of volatile components contained in the thermosetting resin, whereby the volume reduction as well as the formation of voids in the via can be also avoided. Thus, the increase in electric resistance can be suppressed.

Particularly, since the via-holes are provided in the substrate composed of the thermosetting resin film carrying the metallic layer on one side and the thermoplastic resin layer on the other side so that the metallic layer is exposed from the via-holes, and after the plated metal layer is formed on the metallic layer exposed from the bottom of the via-hole by an electro-plating or the like, the via-hole is filled with the electro-conductive thermoplastic resin containing electro-conductive material to form a via, it is possible to minimize the electric resistance of the via as much as possible.

Furthermore, if thermosetting polyimide is used for the thermosetting resin film, thermoplastic polyimide is used for the thermoplastic resin layer and thermoplastic polyimide containing metallic particles is used for the electro-conductive thermoplastic resin paste to be filled in the via-hole, the thermal expansion coefficients of the respective components constituting the multilayer circuit board become substantially the same, and the respective components can be expanded or shrunk in a well-balanced manner even if various heating/cooling cycles are repeated during the production or the use thereof, whereby there is no risk of cracks in the via.

Also, according to a method for the production of a multilayer circuit board according to the present invention, it is possible to readily provide the above-mentioned multilayer circuit board. Since the via, at least part of which is formed of the electro-conductive thermoplastic resin, becomes adhesive during the heat-pressing of the layered substrates carrying vias and circuit patterns thereon, because the thermoplastic resin component becomes adhesive. Also, since the electro-conductive thermoplastic resin forming the via is compressed under pressure, the density of via becomes higher to further improve the electro-conductivity with the circuit patterns.

DETAILED DESCRIPTION OF THE EMBODIMENTS

Figure 1:
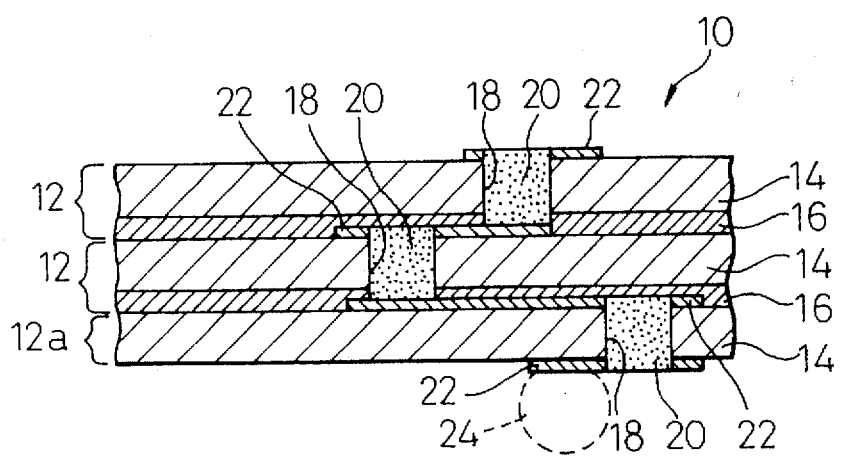
FIG. 1 is a sectional view of one embodiment of the multilayer circuit board according to the present invention.

The present invention will be described in more detail with reference to the attached drawings. FIG. 1 is a sectional view of one embodiment of a multilayer circuit board 10 wherein a plurality of substrates 12, 12, . . . are laminated with each other.

The respective substrate 12 is formed of a blank composed of a thermosetting resin film 14 having a thickness in a range between 25 and 100 μm carrying a metallic layer formed of a copper foil or the like having a thickness between 1 and 20 μm on one side and a thermoplastic polyimide layer 16 having a thickness between 10 and 20 μm on the other side.

The substrate 12 has a via-hole 18 filled with an electro-conductive thermoplastic polyimide containing an electro-conductive material such as metallic particles of gold, silver, copper, nickel, lead or others to form a via 20 and a circuit pattern 22 of a desired shape formed of the metallic layer of the substrate blank, wherein the via 20 and the circuit pattern are electrically connected with each other.

A lowermost substrate 12a in the multilayer circuit board 10 shown in FIG. 1 is formed of a blank carrying metallic layers on the opposite sides of the thermosetting resin film 14, and has a via-hole 18 filled with the above-mentioned electro-conductive thermoplastic polyimide containing the electro-conductive material to form a via 20 and circuit patterns 22 provided by etching the metallic layers on the opposite sides of the thermosetting resin layer 14. In this substrate 12a, the circuit patterns and the via 20 are electrically connected with each other.

The three substrates 12, 12 and 12a are layered with each other as described later and heat-pressed to be integral with each other by the adhesion of the thermoplastic resin layer 16 to result in the multilayer circuit board 10.

The circuit pattern 22 formed on the lower side of the substrate 12a in the multilayer circuit board 10 may have bumps or lead pins (not shown) such as solder balls 24 as external terminals.

Also, the circuit patterns formed on the respective sides of the uppermost and lowermost layers may be coated with suitable protective films of solder resist or the like (not shown) to prevent the oxidation of the circuit patterns.

Particularly, when the multilayer circuit board 10 is used as a circuit board of BGA (Ball Grid Array) TYPE or PGA (Pin Grid Array) type for mounting semiconductor elements, a protective film is preferably formed on the uppermost and/or lowermost surface by solder paste or others, except for an area on the uppermost surface where the circuit pattern is provided for the connection with the semiconductor element and an area on the lowermost surface where the circuit pattern is provided for the connection with the external terminals (such as solder balls or lead pins).

According to the multilayer circuit board 10 shown in FIG. 1, no gas generates during the heat treatment in the production process thereof because the via 20 is formed of electro-conductive thermoplastic resin, unlike the conventional circuit board wherein thermosetting resin is used, whereby it is possible to avoid the volume reduction, generation of voids and increase in electro-resistance caused by the gas generation. Consequently, the multilayer circuit board 10 shown in FIG. 1 has a high reliability.

When the thermosetting resin film 14, the thermoplastic resin layer 16, and the electro-conductive thermoplastic resin in the via-hole 18 are prepared as polyimide resin, the thermal expansions of the above three members are substantially the same, whereby the three members can expand and shrink in accordance with each other even if various heating and cooling cycles are repeated during the production and the use of the multilayer circuit board 10. Accordingly, there is no risk of cracks in the via due to the thermal expansion and contraction of the multilayer circuit board 10.

The multilayer circuit board 10 shown in FIG. 1 is preferably used as a circuit board for mounting one or more electronic parts such as semiconductor chips or others.

While the same substrates 12, 12 and the different one 12a are layered together in the embodiment shown in FIG. 1, it is also possible to layer a plurality of the same substrates 12 with each other, having the same structure wherein the thermoplastic resin layer 16 is formed on one side thereof. In such a case, a metallic layer such as a copper foil may be adhered onto the lowermost side after the substrates are laminated, and processed to be a circuit pattern for being electrically connected with the via exposed externally of the lowermost substrate.

In this regard, the number of substrates 12 to be layered with each other is not limited to the specified number in the multilayer circuit board 10 shown in FIG. 1.

Figure 2:
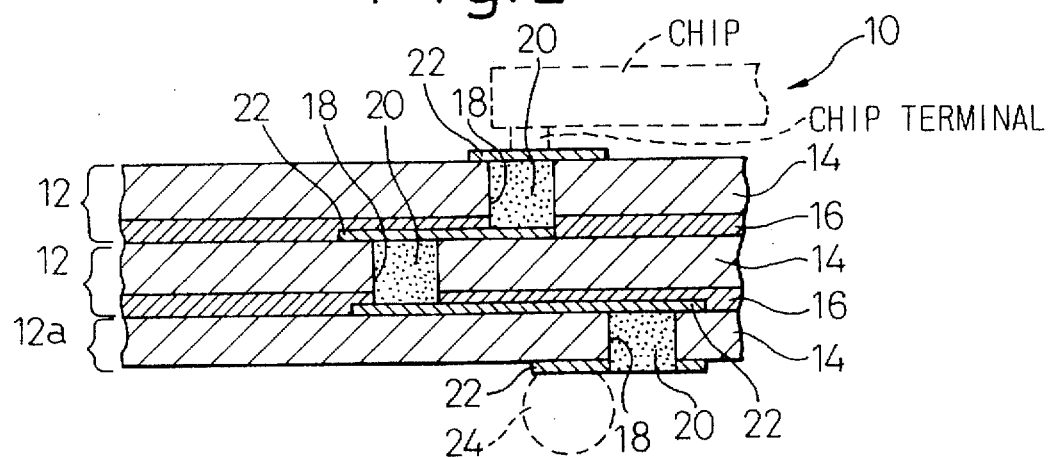
FIG. 2 is a sectional view of another embodiment of the multilayer circuit board according to the present invention.

FIG. 2 illustrates another embodiment of a multilayer circuit board 10. In this drawing, the same parts as in FIG. 1 are denoted by the same reference numerals and the explanation thereof will be eliminated.

Differences in the multilayer circuit board 10 shown in FIG. 2 from that of FIG. 1 are in that a via-hole 18 provided in a substrate 12 penetrates a thermosetting resin film 14 and a thermoplastic resin layer 16 only so that a lower surface of the metallic layer formed on one side of the thermosetting resin film 14 is exposed on the via-hole 18. Also, a via-hole 18 provided in a substrate 12a composed of a thermosetting resin film 14 and metallic layers formed on the opposite sides thereof also penetrates the lower side metallic layer and the thermosetting resin film 14 only so that a lower surface of the upper side metallic layer is exposed to via-hole 18.

A via 20 is formed by filling the respective via-hole 18 with electro-conductive thermoplastic resin containing an electro-conductive material. According to this via 20, it is possible to have a better electro-conductivity with circuit patterns 22. Furthermore, since the opening of the via-hole 18 is blocked by the circuit pattern 22 when a semiconductor element is mounted on the uppermost circuit pattern, it is also possible to directly place the semiconductor element on the circuit pattern positioned above the top of the via by mean of a flip bonding method or others.

In this regard, it is also possible to provide the multilayer circuit board 10 of FIG. 2 with external terminals such as solder balls on the lowermost circuit pattern 22.

Figure 3:
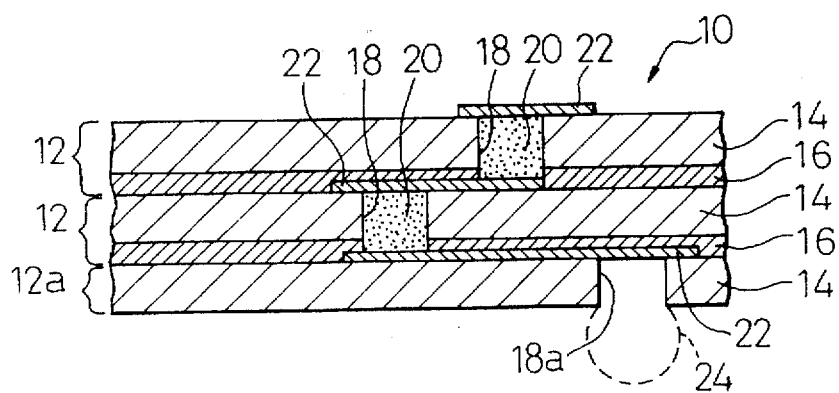
FIG. 3 is a sectional view of a further embodiment of the multilayer circuit board according to the present invention.

FIG. 3 illustrates a further embodiment of a multilayer circuit board 10. In this drawing, the same parts as in FIGS. 1 and 2 are denoted by the same reference numerals and the explanation thereof will be eliminated.

Differences of the multilayer circuit board 10 shown in FIG. 3 from those of FIGS. 1 and 2 are in that, in the lowermost substrate 12a, a lower side metallic layer is eliminated and a via-hole is not filled with an electro-conductive thermoplastic resin, but is left empty to provide a terminal hole 18a.

The multilayer circuit board 10 can be marketed in a state as shown in FIG. 3, or after forming a bump 24 such as a solder ball in the terminal hole 18a. In this regard, a metallic layer such as copper or tin may be preferably provided on the inner wall of the terminal hole 18a by mean of an electroless plating to enhance the wettability to a solder.

Figure 4A:
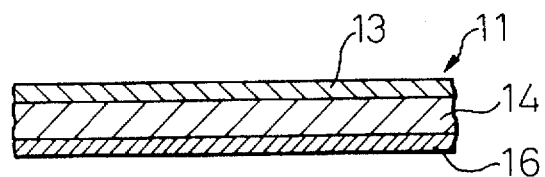
FIGS. 4(a) to 4(f) are the illustrations for explaining a production process for the substrate shown in FIG. 1.

The multilayer circuit board 10 shown in FIGS. 1 through 3 can be produced by methods shown in FIGS. 4(a) to 4(f) and 5. In the production method shown in FIGS. 4(a) to 4(f), a blank 11 is used, in which the blank 11 is composed of a thermosetting resin film 14 carrying a metallic layer 13 of copper foil or others on one side and a thermoplastic polyimide layer 16 on the other side, as shown in FIG. 4(a).

Figure 4B:
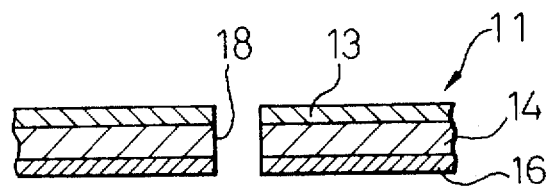
Figure 4C:
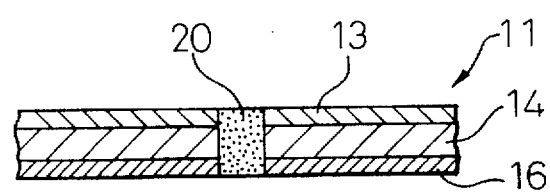

First, suitable number of via-holes 18 are provided at proper positions by a drill or others (FIG. 4(b)). Thereafter, the via-holes 18 are filled with a thermoplastic resin paste containing electro-conductive material by a screen printing or others, which are then heat-treated to form vias 20 (FIG. 4(c)). According to this heat treatment, the thermoplastic resin paste is solidified by the evaporation of solvent contained therein. The heat treatment is preferably carried out, at a first stage, at a temperature lower than a boiling point of the solvent contained in the thermoplastic resin paste to dry the paste, and, at a second stage, at a temperature somewhat higher than the boiling point to completely evaporate the solvent. Concretely, for a thermoplastic resin layer containing an electro-conductive material using N-N-dimethylacetamide (having a boiling point of 166° C.) as a solvent, the first stage is carried out at 150° C. for one hour, and the second stage at 180° C. for 0.5 hours.

In this regard, an amount of the thermoplastic resin paste to be filled in the via hole 18 should be predetermined while taking the amount of solvent to be evaporated into account so that the via 20 having no voids is formed in the via-hole 18.

By solidifying the thermoplastic resin paste containing electro-conductive material filled in the via-hole 18 in such a manner, unlike the solidification of the thermosetting polyimide resin paste containing electro-conductive material, no gas generates to prevent the volume reduction.

If an excessive amount of thermoplastic resin paste is filled in the via-hole 18, it can be removed after being solidified, if necessary, by grinding.

Figure 4D:
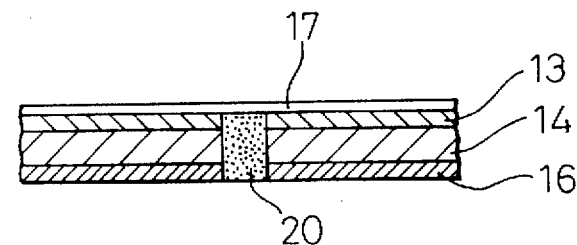
Figure 4E:
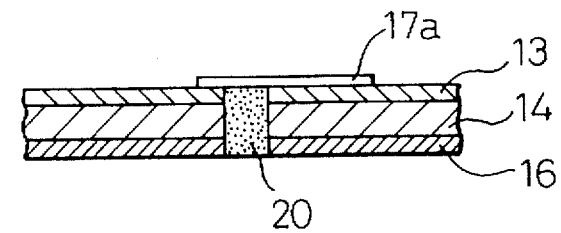
Figure 4F:
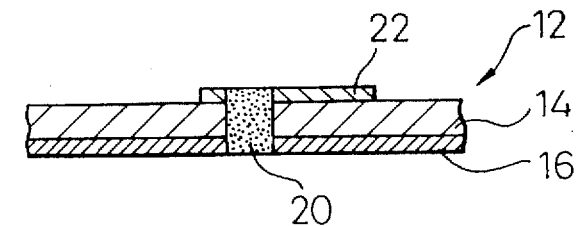

Next, as shown in FIG. 4(d), a photosensitive resist film 17 is formed on the metallic layer 13, and then, as shown in FIG. 4(e), a resist pattern 17a is formed. Further, a circuit pattern 22 to be electrically connected to the via 20 is formed by etching the metallic layer 13 while using the resist pattern 7a as a mask. Thus the substrate 12 shown in FIG. 4(f) is obtained.

Figure 5:
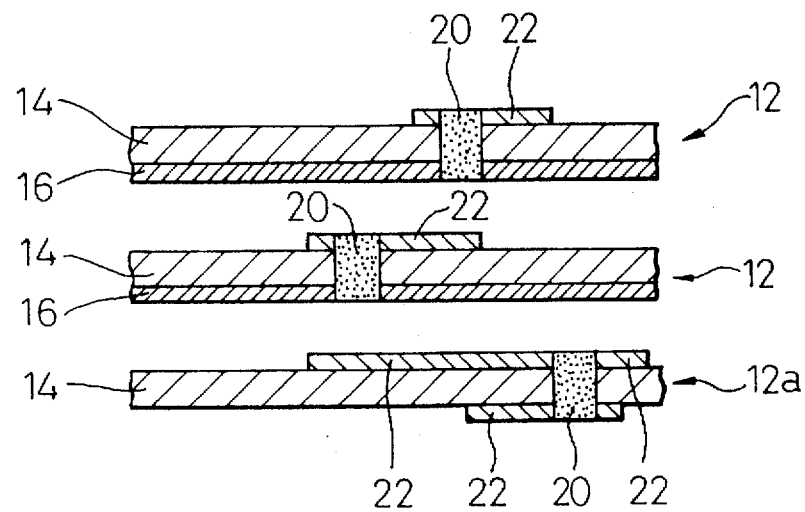
FIG. 5 is the illustration for explaining the assembly process.

Thereafter, as shown in FIG. 5, a suitable number of substrates 12 are layered with each other in a properly aligned manner and heat-pressed together. The heat-pressing is preferably carried out in a subatmospheric (vacuum) chamber at temperature in a range of 220° through 300° C. and at a pressure in a range of 10 through 30 kg/cm$^2$.

According to this heat-pressing, the thermoplastic resin layer 16 is softened to be adhesive, whereby the plurality of substrates 12 are bonded together to provide a multilayer circuit board 10 shown in FIG. 1.

Since the via 20 is formed of thermoplastic resin too, it is also softened to be adhesive during the heat-pressing and, as apparent from the comparison between FIGS. 1 and 5, the via 20 is compressed to be in tight contact and integral with the circuit pattern 22.

In this regard, since the lowermost substrate 12a needs no thermoplastic layer 16 for the adhesion, this substrate 12a is prepared from a blank composed of a thermosetting resin film 14 carrying metallic layers on the opposite sides, in such a manner that a via 20 is formed by filling the via hole with a thermoplastic resin containing electro-conductive material and circuit patterns 22, 22 are formed so as to be connected with the via 20.

Then, the substrate 12a carrying the circuit patterns 22, 22 and the substrates 12, 12 are layered with each other and heat-pressed together.

While the circuit pattern 22 in FIGS. 4(a) to 4(f) and 5 is formed by etching the metallic layer 13 after the via 20 has been completed, it is also possible to initially form a circuit pattern 22 and then provide a via-hole 18 which in turn is filled with a thermoplastic resin paste to make a via 20.

It is also possible to produce the multilayer circuit boards 10 shown in FIGS. 2 and 3 in the similar manner to the production of the board shown in FIG. 1.

That is, a via-hole 18, to which the bottom of a metallic layer formed on one side of a thermosetting resin film 14, is exposed can be provided in a blank composed of the thermosetting resin film 14 carrying a metallic layer on one side and a thermoplastic resin layer 16 on the other side by a laser beam applied from the side on which the thermoplastic resin layer 16 is present, while taking care not to penetrate the metallic layer. The succeeding steps such as one for filling the thermoplastic resin containing electro-conductive material are the same as shown in FIG. 4. In this case, the circuit pattern may be formed by etching the metallic layer either after the via 20 has been formed, or before the via-hole is provided and the via is formed therein.

When using the blank having metallic layers on the opposite sides, the via-hole can be provided by melting and removing a portion of the metallic layer on the opposite side, in which the via-hole is to be provided, by an etching and then penetrating the thermosetting resin film 14 by an excimer laser.

If a drill is used for forming the via-hole, the melt-removal of the metallic layer is unnecessary.

When a semiconductor element is mounted on the multilayer circuit board 10 shown in FIG. 1, 2 or 3, an element-mounting area is defined on the uppermost substrate 12. The semiconductor element is placed in this area, electrically connected with the circuit patterns of the uppermost substrate 12 through wires, and embedded in a potting resin or others.

In the multilayer circuit board 10 shown in FIG. 2 or 3, since no electro-conductive thermoplastic resin paste filled in the via-hole 18 is exposed and the circuit pattern 22 is provided directly above the via 20, the semiconductor element can be mounted on the circuit pattern 22 provided directly above the via 20. Accordingly, the semiconductor element can be directly mounted onto the circuit pattern 22 in accordance with a flip chip process (not shown).

Furthermore, in the multilayer circuit board 10 shown in FIG. 1, it is possible to provide the external terminals in the circuit pattern 22 on the lowermost substrate 12a by lead pins or solder balls (not shown).

On the other hand, in the multilayer circuit board 10 shown in FIG. 3, the external terminal can be provided by a bump such as a solder ball formed in the terminal hole 18a.

In the multilayer circuits board shown in FIGS. 1 to 3, 4(a) to 4(f), and 5 the via is formed by the thermoplastic resin containing electro-conductive material. The thermoplastic resin containing a silver filler has a resistance of about $10^{-3}$ $\Omega$cm, while metal, for example, nickel has a resistance of about $10^{-6}$ $\Omega$cm. Therefore, there may be a case wherein a resistance of via formed of the thermoplastic resin containing electro-conductive material should be further lowered.

Figure 6:
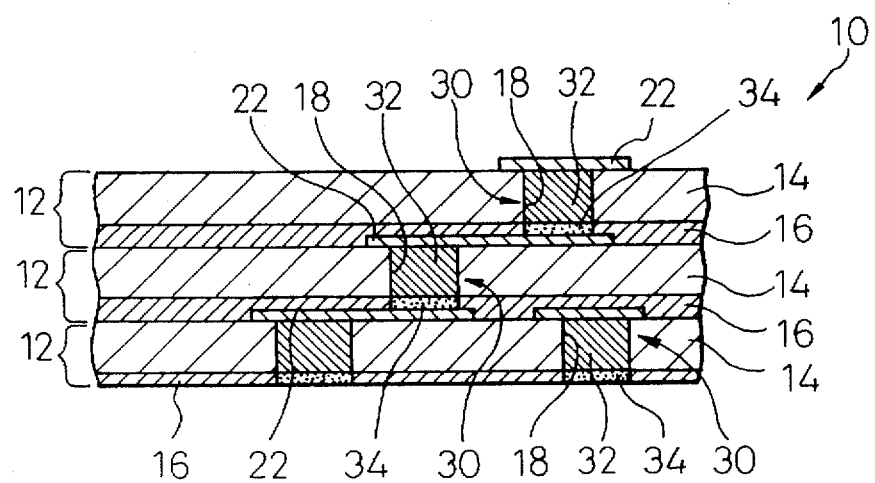
FIG. 6 is a sectional view of a still further embodiment of the multilayer circuit board according to the present invention.

In such a case, a multilayer circuit board 10 shown in FIG. 6 is suitable. In FIG. 6, the same parts as in FIG. 5 are denoted by the same reference numerals and the explanation thereof will be eliminated.

A thermosetting resin film 14 of thermosetting polyimide for forming a substrate 12 carries a circuit pattern 22 of copper on one side and a thermoplastic resin layer 16 of thermoplastic polyimide on the other side.

The substrate 12 has a via 30. The via 30 is formed by filling an electro-conductive plastic resin layer 34 of thermoplastic polyimide containing metallic particles such as gold, silver, copper, nickel or lead in a via-hole 18 provided in the thermosetting resin layer 14 to open through the thermoplastic resin layer 16 on one side but being blocked on the other side by a metallic layer 32 of nickel formed by a plating at a predetermined thickness on the rear side of the circuit pattern 22. This via 30 is electrically connected with the circuit pattern 22.

The plated metallic layer 32 may be formed of copper, lead, silver, gold or others.

The electric resistance of the via 30 becomes smaller as a thickness of the plated metallic layer 32 decreases; i.e., as a thickness of the electro-conductive thermoplastic resin layer 34 increases. This is because a ratio of the metallic layer 32 in the via 30 increases.

However, the thickness of the electro-conductive thermoplastic resin layer 34 is preferably 5 µm or more, because the electro-conductive thermoplastic resin layer of such a thickness exhibits a good adhesivity similar to the thermoplastic resin layer 16.

Three substances 12 of the above type, each carrying the via 30 and the circuit pattern 22, are layered with each other and heat-pressed as described later, to be an integral body by the adhesivity of the thermoplastic resin layer 16. Thus the multilayer circuit board 10 shown in FIG. 6 is obtained.

The substrate 12 constituting the multilayer circuit board 10 shown in FIG. 6 can be produced by a production method shown in FIGS. 7(a) to 7(e).

Figure 7A:
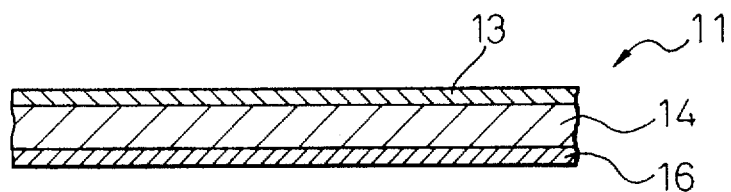
FIGS. 7(a) to 7(e) are the illustrations for explaining a production process for the substrate shown in FIG. 6.

As shown in FIG. 7(a), a blank 11 for the substrate is composed of a thermosetting resin layer 14 carrying a metallic layer 13 of copper foil or others on one side and a thermoplastic resin layer 16 on the other side.

Figure 7B:
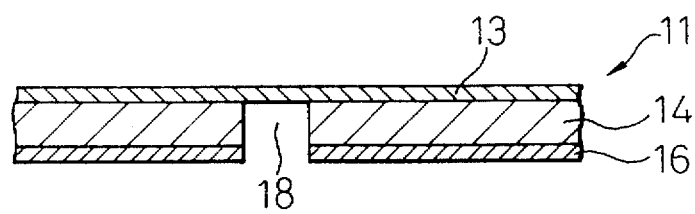
Figure 7C:
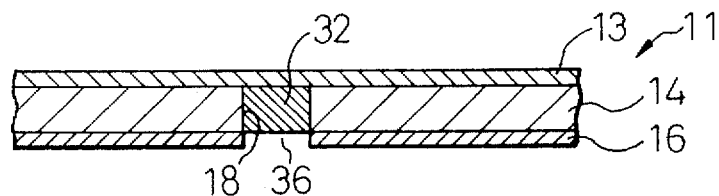

First, a desired number of via-holes 18 are provided on the blank 11 by a laser beam so that the lower surface of the metallic layer 13 is exposed to the via-hole 18 (FIG. 7(b)), and a plated metallic layer 32 is formed on the back side of the metallic layer 13 (FIG. 7(c)). This plated metallic layer 32 is provided by an electro-plating while using the metallic layer 13 as an electrode. The electro-plating continues until a vacant space 36 in the via-hole 18 becomes as thick as the thermoplastic resin layer 16.

Figure 7D:
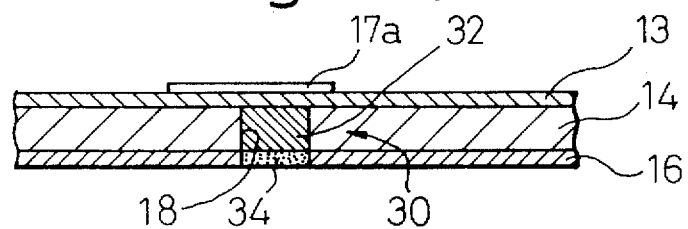

Then, a thermoplastic resin paste containing electro-conductive material 34 is filled in the vacant space 36 of the via-hole 18 by screen printing or other methods, and suitably is heat-treated to make a via 30 (FIG. 7(d)).

This heat treatment may be carried out in a similar manner as the production of the substrate 12 shown in FIG. 4.

Figure 7E:
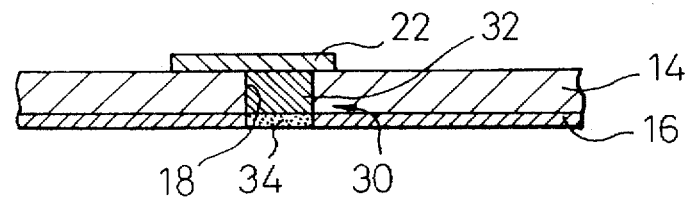

After the via 30 has been formed in such a manner, a resist pattern 17a is formed from a photosensitive resist film provided on the metallic layer 13 as shown in FIG. 7(d). Further, while using this resist pattern 17a as a mask, the metallic layer 13 is etched to provide a desired circuit pattern 22 to be electrically connected with the via 30. Thus, the substrate 12 shown in FIG. 7(e) is obtained.

Thereafter, a suitable number of substrates 12 are layered and heat-pressed, while being properly aligned with each other. The heat-pressing is preferably carried out in a sub-atmospheric (vacuum) chamber at a temperature in a range between 220° and 300° C. and at a pressure in a range between 10 and 30 kg/cm$^2$.

By this heat-pressing, the thermoplastic resin layer 16 is softened to be adhesive, whereby the plurality of substrates 12 are bonded together to result in the multilayer circuit board 10 shown in FIG. 6.

Since the electro-conductive thermoplastic resin layer 34 is also softened to be adhesive during the heat-pressing, the via 30 and the circuit pattern 22 are tightly bonded together.

Also, since the plated metallic layer 32 forming the via 30 is difficult to be compressed during the heat-pressing in comparison with the via 20 formed of the electro-conductive thermoplastic resin, the multilayer circuit board 10 is maintained at a constant thickness.

Figure 8:
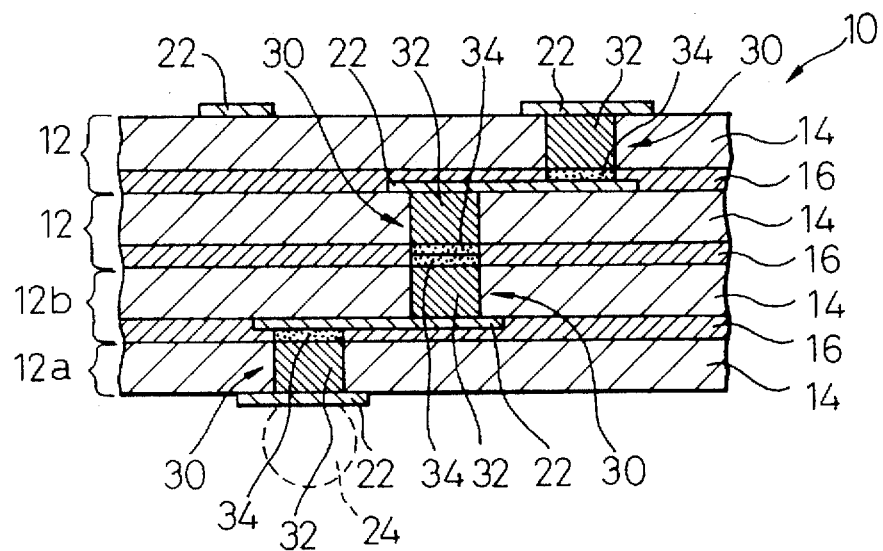
FIG. 8 is a sectional view of still another further embodiment of the multilayer circuit board according to the present invention.
Figure 9:
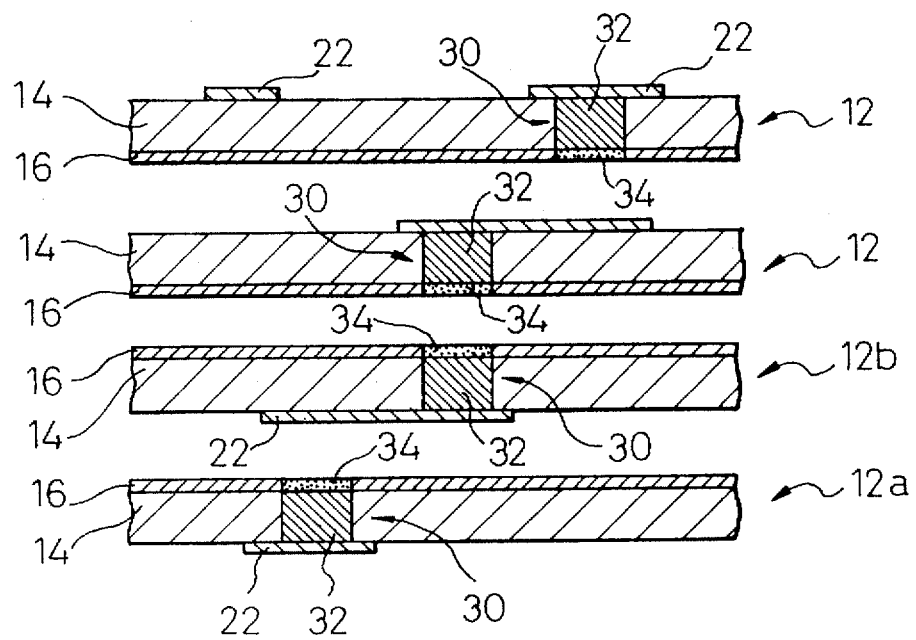
FIG. 9 is the illustration for explaining the assembly process.

If an external terminal (solder ball or lead pin) is bonded to the multilayer circuit board 10 shown in FIG. 6, it is necessary to provide a circuit pattern 22 on the lower side of a lowermost substrate 12a, as shown in FIG. 8. For this purpose, in a multilayer circuit board 10 shown in FIG. 8, an intermediate substrate 12b is arranged.

Each of the lowermost substrate 12a and the intermediate substrate 12b is composed of a thermosetting resin film 14 carrying a thermoplastic resin layer 16 on the upper side and a circuit pattern 22 on the lower side, and has a via 30 formed of a laminate of a plated metallic layer 32 and an electro-conductive thermoplastic resin layer 34 in a via-hole 18 provided so that the circuit pattern 22 is exposed to the via-hole.

Accordingly, as shown in FIG. 8, by layering the substrate 12 with the substrate 12b, the via 30 of the substrate 12 can be connected with the via 30 of the intermediate substrate 12b, whereby the circuit pattern 22 formed on the upper side of the substrate 12 is electrically conductive to the circuit pattern 22 formed on the lower side of the substrate 12b through the vias 30, 30.

The substrate 12b can be obtained in a similar manner as shown in FIG. 7(a) to 7(e), and is layered with the substrate 12 while taking care that the via 30 of the substrate 12a is connected with that of the substrate 12.

Thereafter, the substrate 12a is layered on the lower side of the substrate 12 so that the circuit pattern 22 formed on the substrate 12b is in contact with the via 30 formed in the substrate 12a. Thus, the multilayer circuit board 10 shown in FIG. 8 is obtained, wherein the circuit patterns 22 are formed on the uppermost side and the lowermost side, respectively.

As described above, according to the multilayer circuit board 10 shown in FIG. 8, the via 30 and the circuit pattern 22 of the substrate 12b are electrically connected with the vias 30 of the substrates 12 and 12a holding the substrate 12b therebetween.

The circuit pattern 22 formed on the lower side of the lowermost substrate 12a may have a solder ball 24 or a lead pin (not shown) functioned as an external terminal.

Also, the circuit patterns provided on the uppermost and lowermost sides are preferably covered with suitable protecting coatings (not shown) to prevent the oxidation thereof.

Particularly, when the multilayer circuit board 10 shown in FIG. 1 is used as circuit boards of BGA type and PGA type for mounting semiconductor chips thereon, protecting coatings of solder resist or others are preferably provided on the uppermost and lowermost sides except for areas of the circuit patterns on the uppermost side to be connected with the semiconductor chips and areas of the circuit patterns on the lowermost side to be connected with the external terminals (solder balls or lead pins). The semiconductor element mounted on the circuit board is connected to the circuit patterns 22 by means of connecting means, such as wire bonding, flip-chip bonding or others.

The substrates 12, 12, 12b and 12a are layered with each other while being properly aligned, and are heat-pressed together to be the multilayer circuit board 10 shown in FIG. 8. The heat-pressing is preferably carried out in a subatmospheric (vacuum) chamber at a temperature in a range between 220° and 300° C. and at a pressure in a range between 10 and 30 kg/cm².

During the heat-pressing, the thermoplastic resin layer 16 is softened to be adhesive, whereby the respective substrates can be bonded together.

Also, since the electro-conductive thermoplastic resin layer 34 in the via 30 of the substrate 12 and the electro-conductive thermoplastic resin layer 34 in the via 30 of the substrate 12b are softened during the heat-pressing, while being in contact with each other, they are adhered with each other to form a single via. Furthermore, since the plated metallic layers 32, 32 are connected with each other through this combined via of the electro-conductive thermoplastic layers 34, 34 and durable against a compressive force, the multilayer circuit board 10 is maintained at a constant thickness.

Since the circuit pattern 22 of the substrate 12b can be provided on the lower side thereof as shown in FIG. 8, it is possible to obtain a multilayer circuit board 10 capable of mounting an external terminal on one side by solely layering the substrates 12 and 12b.

The multilayer circuit board 10 capable of mounting an external terminal on one side can also be derived from the multilayer circuit board shown in FIG. 1 through 3, by positioning one of the substrates 12, 12 upside down so that the vias 20, 20 of the two substrates are directly in contact with each other.

Figure 10:
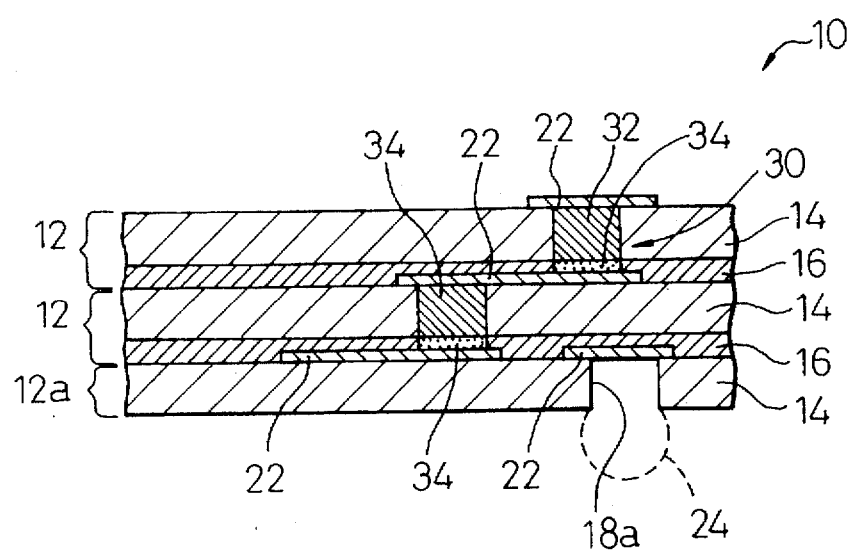
FIG. 10 is a sectional view of a still further embodiment of the multilayer circuit board according to the present invention.

FIG. 10 shows a multilayer circuit board 10 capable of mounting an external terminal on one side without the provision of the intermediate substrate 12b shown in FIG. 8. This multilayer circuit board 10 is composed of a substrate 12a consisting of a thermoplastic resin film 14 carrying a circuit pattern 22 on one side, which pattern is exposed from the bottom of a terminal hole 18a, and a substrate 12 layered with the substrate 12a with the terminal hole 18a exposed outside.

An external terminal such as a solder ball 24 or the like can be provided in the terminal hole 18a.

In this regard, a thermoplastic resin layer 16 is unnecessary on the lower side (where the terminal hole 18a is opened) of the substrate 12a because none of other substrates is bonded thereto.

It should be understood by those skilled in the art that the foregoing description relates to only some preferred embodiments of the disclosed invention, and that various changes and modifications may be made to the invention without departing from the spirit and scope thereof.

What we claim is:

1. A multilayer circuit board comprising:
   a plurality of substrates;
   each of said substrates comprising: a thermosetting resin film having first and second surfaces, a metal layer formed on said first surface and a thermoplastic polyimide film formed on said second surface;
   each of said substrates having at least one via hole, extending through said substrates, except for said metal layer, in such a manner that one end of said at least one via hole is closed by said metal layer;
   a layer of metallic plating, of predetermined thickness, laminated with a thermoplastic polyimide resin containing electrically conductive material, to form an electrically conductive via; and
   said metal layer being defined as a predetermined circuit pattern electrically connected to said via; and
   said plurality of substrates being laminated in such a manner that each substrate is adhered to an adjacent substrate by said thermoplastic polyimide film, and said electrically conductive via extending through said thermoplastic polyimide film is adhered to and electrically connected to said circuit pattern of said adjacent substrate.

2. A multilayer circuit board as set forth in claim 1, wherein said thermosetting resin film is a thermosetting polyimide film.

3. A multilayer circuit board comprising:

one or more first substrates:

each of said first substrates comprising: a thermosetting resin film having first and second surfaces, a metal layer formed on said first surface and a thermoplastic polyimide film formed on said second surface;

each of said first substrates having at least one via hole extending through said first substrates, except for said metal layer, in such a manner that one end of said at least one via hole is closed by said metal layer;

a layer of metallic plating, of predetermined thickness, laminated with a thermoplastic polyimide resin containing electrically conductive material, to form a first electrically conductive via; and said metal layer being defined as a first predetermined circuit pattern electrically connected to said first via;

a second substrate comprising: a thermosetting resin film having respective surfaces, metal layers formed on said respective surfaces, said second substrate having at least one via hole in which a second electrically conductive via is formed, and said metal layers being defined as predetermined respective circuit patterns electrically connected to said second via; and said one or more first substrates and said second substrate being laminated in such a manner that each first substrate is adhered to an adjacent substrate by means of said thermoplastic polyimide film of the first substrate, and said electrically conductive via extending through said thermoplastic polyimide film is adhered to and electrically connected to said circuit pattern of each adjacent substrate.

4. A multilayer circuit board as set forth in claim 3, wherein said second electrically conductive via comprises a thermoplastic polyimide resin containing electrically conductive material filled in said via hole of the second substrate.

5. A multilayer circuit board as set forth in claim 3, wherein said via hole of the second substrate is filled with a layer of metallic plating of predetermined thickness, and said metallic plating is laminated with a thermoplastic polyimide resin containing electrically conductive material, to form the second electrically conductive via.

6. A multilayer circuit board comprising:

one or more first substrates:

each of said first substrates comprising: a thermosetting resin film having first and second surfaces, a metal layer formed on said first surface and a thermoplastic polyimide film formed on said second surface;

each of said first substrates having at least one via hole, extending through said first substrate, except for said metal layer in such a manner that a part of said metal layer is exposed to a bottom of said via-hole;

a layer of metallic plating, of predetermined thickness, laminated with a thermoplastic polyimide resin containing electrically conductive material, to form an electrically conductive via; and said metal layer being defined as a first predetermined circuit pattern electrically connected to said first via; and a second substrate comprising: a thermosetting resin film having respective surfaces, a metal layer formed on one of said respective surfaces, said second substrate having at least one terminal hole penetrating said thermosetting resin film, said metal layer being defined as a predetermined circuit pattern, a part of which covers one end of said terminal hole; and said one or more first substrates and said second substrate being laminated to form a laminated structure in such a manner that said terminal hole is opened outside and each first substrate is adhered to an adjacent substrate by means of said thermoplastic polyimide film of the first substrate, and said electrically conductive via extending through said thermoplastic polyimide film is adhered to and electrically connected to said circuit pattern of said adjacent substrate.

7. A multilayer circuit board as set forth in claim 6 further comprising a bump for external connection provided in said terminal hole so as to protrude from said laminated structure.

* * * * *